United States Patent [19]

O'Shaughnessy et al.

[11] Patent Number: 4,904,884
[45] Date of Patent: Feb. 27, 1990

[54] SCHMITT TRIGGER ADAPTED TO INTERFACE BETWEEN DIFFERENT TRANSISTOR ARCHITECTURES

[75] Inventors: Timothy G. O'Shaughnessy, Norco; David K. Chung, Lake Elsinore, both of Calif.

[73] Assignee: Western Digital Corporation, Irvine, Calif.

[21] Appl. No.: 184,243

[22] Filed: Apr. 21, 1988

[51] Int. Cl.⁴ .................. H03K 3/29; H03K 5/153; H03K 19/094
[52] U.S. Cl. .................. 307/290; 307/279; 307/354; 307/359; 307/451
[58] Field of Search ............... 307/451, 464, 357, 290, 307/359, 354, 279

[56] References Cited

U.S. PATENT DOCUMENTS

| | | | |
|---|---|---|---|
| 3,873,856 | 3/1975 | Gerlach | 307/279 |
| 3,904,888 | 9/1975 | Griggin et al. | 307/451 |
| 3,984,703 | 10/1976 | Jorgensen | 307/279 |
| 4,394,587 | 7/1983 | McKenzie et al. | 307/359 |
| 4,438,349 | 3/1984 | Shoji | 307/354 |
| 4,459,494 | 7/1984 | Takakura | 307/290 |
| 4,490,627 | 12/1984 | Moench et al. | 307/290 |
| 4,563,594 | 1/1986 | Kayama | 307/290 |
| 4,703,201 | 10/1987 | McGrail | 307/290 |
| 4,719,367 | 1/1988 | Denda | 307/290 |
| 4,733,107 | 3/1988 | O'Shaughnessy | 307/290 |

FOREIGN PATENT DOCUMENTS

| | | | |
|---|---|---|---|
| 0023022 | 3/1981 | Japan | 307/290 |
| 0179019 | 10/1983 | Japan | 307/290 |
| 0208926 | 11/1984 | Japan | 307/290 |
| 0177513 | 5/1985 | Japan | 307/290 |
| 0152117 | 8/1985 | Japan | 307/290 |

Primary Examiner—John S. Heyman
Assistant Examiner—Nancy Thai
Attorney, Agent, or Firm—Christie, Parker & Hale

[57] ABSTRACT

A Schmitt trigger having first and second complementary switches is biased to exhibit hysteresis, switching at a high threshold level when the input signal increases, and switching at a low threshold level when the input decreases. The source driver for the Schmitt trigger is coupled to the input of at least one of the complementary switches by transition circuitry, such that the signal level representing one binary value is shifted closer to the level of the power supply voltage corresponding to such binary value without changing the logical value of the signal from the source driver. In one embodiment, the first inverter is a MOS transistor, the threshold level of which is set by a bias voltage applied to the gate of another MOS transistor. The second inverter is a pair of complementary CMOS transistors. In another embodiment, the first inverter also comprises a pair of complementary CMOS transistors. The threshold level is set by selecting the W/L ratio of the CMOS transistors of the first inverter. In another embodiment the first inverter comprises a differential amplifier.

7 Claims, 6 Drawing Sheets

SCHMITT TRIGGER ADAPTED TO INTERFACE BETWEEN DIFFERENT TRANSISTOR ARCHITECTURES

BACKGROUND OF THE INVENTION

This invention relates to Schmitt trigger circuits and, more particularly, to a Schmitt trigger adapted to receive a drive signal from circuitry based upon different transistor architecture.

A Schmitt trigger is a well-known binary circuit that exhibits hysteresis. Thus, a Schmitt trigger changes state at a high threshold level responsive to an increasing signal input and changes state at a lower threshold level responsive to a decreasing signal input. The hysteresis characteristic enables the Schmitt trigger to reject noise effectively, while reshaping a binary signal applied to its input. For this reason, Schmitt triggers are commonly used as the input stages of an integrated circuit chip to receive binary drive signals transmitted from the outputs of another integrated circuit chip. In this setting, a Schmitt trigger must sometimes process binary signals generated by a different transistor architecture. For example, the output driver stage of a chip may be configured in bipolar TTL circuitry to provide the high power level necessary to transmit binary signals from chip to chip, while the input receiving stages and the data processing circuitry on the chip may be configured in CMOS (complementary metal oxide semiconductor) architecture to reduce the power consumption on the chip. Such an interface of different computer architectures may present to the input Schmitt trigger stages of a chip an incompatible drive signal swing that leads to large power consumption. For example, a typical nominal signal swing in TTL circuitry is 0 to 3.5 volts, with a worse case signal swing of 0.8 to 2.0 volts, while CMOS transistor architecture is typically designed to operate on a drive signal swing of 0 to 5.0 volts. In such case, the TTL drive signal may not turn the CMOS transistors completely off because of its relatively small signal swing.

SUMMARY OF THE INVENTION

According to the invention, a pair of redundant CMOS inverters are used to shift the signal level between driving and receiving circuitry based upon different transistor architectures without changing the logical value of the drive signal.

Specifically, a Schmitt trigger having first and second complementary switches is biased to exhibit hysteresis, switching at a high threshold level when the input signal increases from a prior valid low level, and switching at a low threshold level when the input decreases from a prior valid high level. The source driver for the Schmitt trigger is coupled to the input of at least one of the complementary switches by transition circuitry, such that the signal level representing one binary value is shifted closer to the level of the power supply voltage corresponding to such binary value without changing the logical value of the signal from the source driver. Thus, the source driver and the Schmitt trigger can be based upon different transistor architectures, and the corresponding interface can be made compatible by establishing by design the switching threshold of the transition circuitry. In general, the transition circuitry is implemented with first and second tandemly connected logical inverters.

In one embodiment, the first inverter is a MOS transistor, the threshold level of which is set by a bias voltage applied to the gate of another MOS transistor. The second inverter is a pair of complementary CMOS transistors.

In another embodiment, the first inverter also comprises a pair of complementary CMOS transistors. The threshold level is set by selecting the W/L ratio of the CMOS transistors of the first inverter.

In another embodiment the first inverter comprises a differential amplifier.

BRIEF DESCRIPTION OF THE DRAWINGS

The features of specific embodiments of the best mode contemplated of carrying out the invention are illustrated in the drawings, in which.

DETAILED DESCRIPTION OF SPECIFIC EMBODIMENTS

The practice of the invention is illustrated below in connection with three prior Schmitt trigger arrangements, which are the subject of the following patent applications assigned to the assignee of this invention:

Ser. No. 945,310, filed Dec. 22, 1986, now U.S. Pat. No. 4,786,825; Ser. No. 07/074,905, filed July 17, 1987, now U.S. Pat. No. 4,859,873; and Ser. No. 883,957, filed Jul. 10, 1986, now U.S. Pat. No. 4,733,107. The disclosures of these applications are incorporated fully herein by reference.

Figure 1:
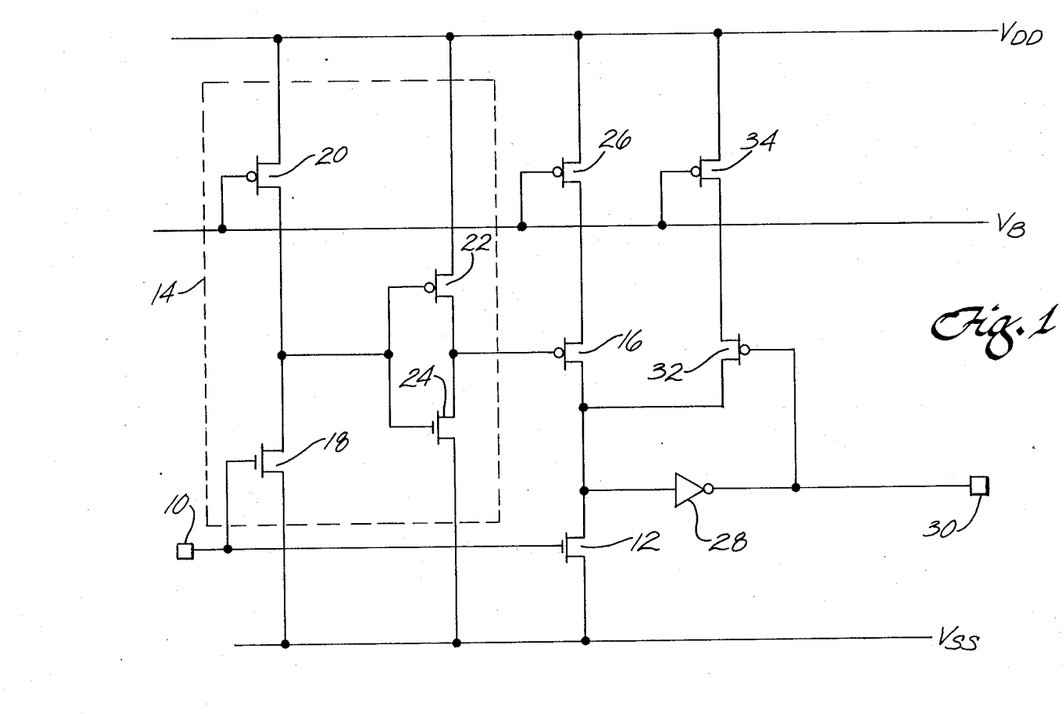
FIG. 1 is a schematic circuit diagram of one embodiment of the invention.

In FIG. 1, an input terminal 10 of a Schmitt trigger is directly connected to the gate of an n-channel input MOS transistor 12. Input terminal 10 is also connected by transition circuitry 14 to the gate of a p-channel first gating MOS transistor 16. Transition circuit 14 comprises first and second inverters connected in tandem between input terminal 10 and the gate of transistor 16. The first inverter comprises an n-channel MOS transistor 18 and a threshold level setting p-channel MOS transistor 20. The gate of transistor 18 is connected to input terminal 10, its source is connected to a voltage bias $V_{SS}$ and its drain is connected to the drain of transistor 20. The source of transistor 20 is connected to a power supply voltage $V_{DD}$, and the gate of transistor 20 is connected to an intermediate bias voltage $V_B$. The second inverter comprises complementary CMOS transistors 22 and 24. The gates of transistors 22 and 24 are connected to the drains of transistors 18 and 20. The source of transistor 22 is connected to power supply voltage $V_{DD}$. The drains of transistors 22 and 24 are connected together and to the gate of transistor 16. The source of transistor 24 is connected to power supply voltage $V_{SS}$. The drains of transistors 12 and 16 are connected together. The source of transistor 12 is connected to power supply voltage $V_{SS}$. The source of transistor 16 is connected to the drain of a threshold level setting p-channel MOS transistor 26. The gate of transistor 26 is connected to bias voltage $V_B$. The source of transistor 26 is connected to power supply voltage $V_{DD}$. Transistors 12 and 16 operate in complementary fashion. Their drains are connected by an inverter 28 to an output terminal 30. Preferably, inverter 28 comprises a pair of CMOS transistors configured in the same way as transistors 22 and 24. The gate of a second current gating transistor 32 is connected to output terminal 30 to form a feedback path. The drain of transistor 32 is connected to the drains of transistors 12 and 16. The source of transistor 32 is connected to the drain of a threshold level setting p-channel MOS transistor 34. The gate of transistor 34 is connected to bias voltage $V_B$. The source of transistor 34 is connected to power supply voltage $V_{DD}$.

Transistors 20, 26 and 34, which remain conductive at all times, produce corresponding drain currents that function to establish voltage threshold levels at which transistors 18 and 12, switch respectively. The threshold levels are selected by controlling the W/L ratio of the respective transistors 20, 26 and 34.

Figure 2:
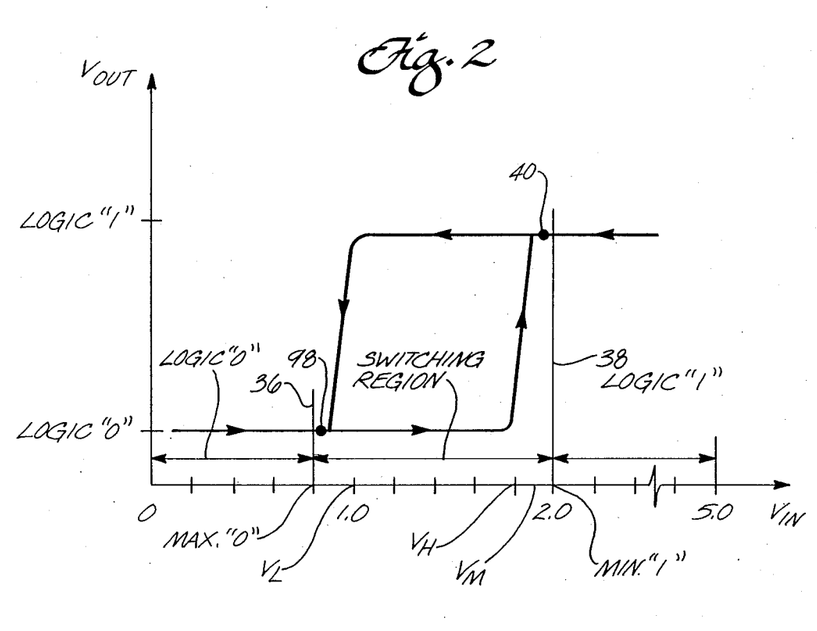
FIG. 2 is a diagram of input voltage $V_{IN}$ versus output voltage $V_{OUT}$ of a Schmitt trigger depicting the threshold level of transition circuitry operating according to the invention.

Reference is made to FIG. 2 for a description of the operation of the Schmitt trigger of FIG. 1. The abscissa represents the input voltage $V_{IN}$ from a source driver and the ordinate represents the output voltage $V_{OUT}$ from the Schmitt trigger on terminal 30. For the purpose of illustration, it is assumed that a source driver based on TTL architecture is connected to input terminal 10, that a logic "0" value signal from this source driver is below 0.8 volts, and that a logic "1" value signal from this source driver is above 2.0 volts, and between this worst case, i.e., maximum, logic "0", and worst case, i.e., minimum, logic "1", the input voltage is switching between logic levels. This is depicted in FIG. 2 by vertical lines 36 and 38, and the switching region on the $V_{IN}$ axis. It is further assumed that power supply voltage $V_{DD}$ is between 4.5 and 5.5 volts and that power supply voltage $V_{SS}$ is ground. When $V_{IN}$ is at a logic "0" value, i.e., to the left of line 36, transistor 12 is turned off. In transition circuitry 14, transistor 18 is turned off, transistor 22 is turned off, and transistor 24 is turned on. This turns transistor 16 on. Thus, the logic 37 0" level at input terminal 10 is transmitted to the gate of transistor 16 by transition circuitry 14 by virtue of the first and second inverters thereof, and a voltage level near power supply voltage $V_{SS}$ is applied through transistor 24 to the gate of transistor 16. Inverter 28 inverts the logic "1" value at the drain of transistor 12 to a logic "0" value at output terminal 30 and the gate of transistor 32. As a result, transistor 32 is turned on. By way of example, the high threshold $V_H$ is set at 1.8 volts by the current flowing through transistors 26 and 34. As the signal level of the source driver increases in the direction of the arrows toward a logic "1" value, transistor 12 turns on, and as the signal on terminal 10 increases, the drain current of transistor 12 exceeds the current supplied by transistor 26 and 34, and the drain voltage of transistor 12 decreases. When the input voltage on terminal 10 exceeds the high threshold $V_H$ on its way to the logic "1" value to the right of line 38, transistor 32 turns off because of the feedback path from output terminal 30. Transistor 18 is set at a threshold level $V_M$, by way of example, 1.9 volts. Thus, after the input signal exceeds the high threshold $V_H$ and exceeds threshold level $V_M$ during its transition to a logic "1" value as depicted at a point 40 (FIG. 2), transistor 18 turns off, which turns transistor 22 on and turns transistor 24 off. This applies to the gate of transistor 16 a voltage level near power supply voltage $V_{DD}$ through transistor 22. As a result, negligible current flows through transistor 16. Thus, as the input signal, transitions between a logic "0" value and a logic "1" value, a voltage level near one rail, i.e., power supply voltage $V_{DD}$, or the other rail, i.e., power supply voltage $V_{SS}$ is applied to the gate of transistor 16 through transistor 22 or transistor 24, although the input signal may only transition through a much smaller voltage swing, e.g., 0.8 volts to 2.0 volts. This ensures that transistor 16 turns completely on and completely off as the Schmitt trigger switches.

In contrast, if input terminal 10 were directly connected to the gate of transistor 16 as in the prior art, the voltage level applied to the gate of transistor 16 at the logic "1" value of the source driver may be much less than power supply voltage $V_{DD}$, i.e., as low as 2.0 volts, and a substantial idling current might flow through transistor 16 while the Schmitt trigger idles at the logic "1" value. This causes substantial power consumption because transistor 16 is not completely turned off.

In summary, although the voltage swing of the source driver may be as small as 0.8 volts to 2.0 volts, the voltage swing applied to the gate of transistor 16 is nearly 5 volts by virtue of the level shifting function performed by transition circuitry 14.

By way of example, the low threshold level VL is set at 1.0 volt by the current flowing through transistor 16. (Transistor 32 is turned off when the Schmitt trigger idles at the "1" value.) As the signal level of the source driver decreases in the direction of the arrows toward a logic "0" value, transistor 12 becomes less conductive when the signal on terminal 10 drops below low threshold level VL on its way to the logic "0" value to the left of line 36. Transistor 32 turns on by virtue of the feedback path from output terminal 30 to reestablish the high threshold level $V_H$. At the same time, transistor 18 turns off, transistor 22 turns off, and transistor 24 turns on to apply a voltage level near power supply voltage $V_{SS}$ to the gate of transistor 16.

It should be noted that the inverters of transition circuitry 14 do not delay the operation of the Schmitt trigger, because input terminal 10 is directly connected to the decision-making MOS transistor on logic "0" to logic "1" transitions, i.e., transistor 12. In fact they speed up the operation of the Schmitt trigger on logic "1" to logic "0" transitions and improve reliability by applying power supply voltage $V_{SS}$ to the gate of transistor 16 near the start of each transition, i.e., at threshold level $V_M$. This permits the drain of transistor to start charging earlier during a logic "1" to logic "0" transition in anticipation thereof. The idling drain current through transistor 20 in the logic "0" state is of the order of one-tenth of the idling drain current that could flow through transistor 16 in the absence of transition circuitry 14. Thus, power consumption is substantially reduced by transition circuitry 14 at the expense of a small idling current when input terminal 10 is at or near VDD.

Preferably, the threshold $V_M$ of transition circuit 14 lies between the minimum logic "1" value, e.g., 2 volts, and the high threshold $V_H$, e.g., 1.8 volts. As shown in the example of FIG. 2, threshold level $V_M$ lies at 1.9 volts. If threshold level $V_M$ lies above the minimum logic "1" value, i.e., to the right of line 38, transition circuit 14 will not reliably shut down the idling current through transistor 16 for all input signal conditions and more power will be consumed. The described operation also occurs if threshold level $V_M$ is set between high threshold level $V_H$ and low threshold level $V_L$, but, because the inverters of transition circuitry 14 change state later in time while switching from a logic "1" value to a logic "0" value in such case, the inverters of transition circuit 14 do not have as much time to remove the power shut-down voltage from the gate of transistor 16 in preparation for its turning on. If threshold $V_M$ is less than lower threshold $V_L$, transistor 16 may be shut down for some input signal conditions of the source driver at the logic "0" value. In summary, high threshold level $V_H$ can lie anywhere above low threshold level $V_L$, but is preferably set between high threshold level $V_H$ and the minimum logic "1" value.

Figure 3:
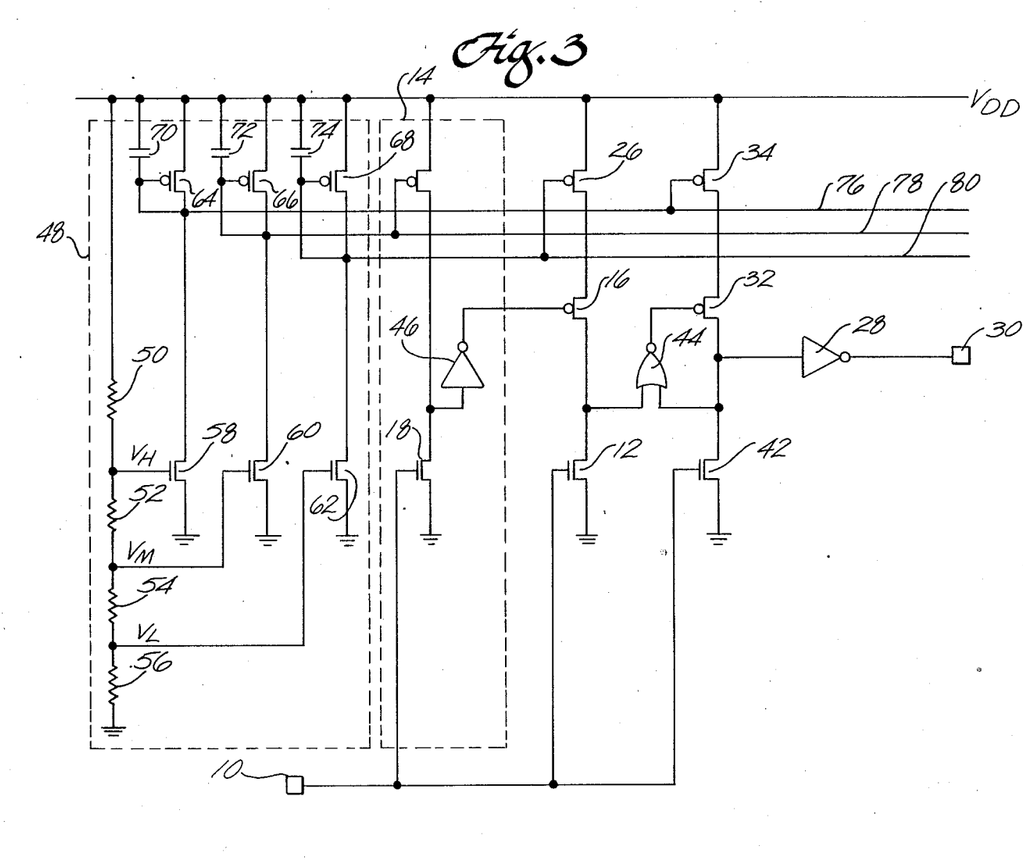
FIG. 3 is a schematic circuit diagram of another embodiment of the invention.

In FIG. 3, transition circuitry 14 is shown with another type of Schmitt trigger and a temperature and process compensating bias arrangement. The components in common with the circuitry of FIG. 1 carry the same reference numerals. In this and some of the following embodiments of the invention, power supply voltage $V_{SS}$ is shown as ground. In addition to being connected to the gate of transistor 12, input terminal 10 is also connected to the gate of another input n-channel MOS transistor 42. The source of transistor 42 is connected to ground, and its drain is connected to the input of inverter 28, the drain of a second current gating p-channel MOS transistor 32 and one input of a NOR gate 44. Preferably, NOR gate 44 is implemented with CMOS circuitry in a conventional configuration, so the gate and drain voltages swing from rail to rail in operation. The drain of transistor 12 is connected to the other input of NOR gate 44. The output of NOR gate 44 is connected to the gate of transistor 32. Transistors 22 and 24 (FIG. 1) are shown as an inverter 46.

When the input drive signal at terminal 10 is at a logic "0" value, transistors 12 and 42 are turned off, transistors 16 and 32 are turned on, transistor 18 is turned off, both inputs to NOR gate 44 are at a logic "1" value, the outputs of inverters 46 and 28 are at a logic "0" value, and the gates of transistors 16 and 32 are near power supply voltage $V_{SS}$. The bias current of transistor 26 determines the low threshold level $V_L$, and the bias current through transistor 34 establishes the high threshold level $V_H$.

As the input signal increases from a logic "0" value and rises above the low threshold level $V_L$, transistor 12 turns on and transistor 16 turns off. As the input signal increases further and rises above the high threshold level $V_H$, transistor 42 turns on and transistor 32 turns off because the output of NOR gate 44 assumes a logic "1" value. This places output terminal 30 at a logic "1" value. As the input signal, decreasing from a logic "1" value, crosses the high threshold level $V_H$, no change in state occurs because of the feedback path provided by NOR gate 44. When the input signal crosses the low threshold level $V_L$, transistors 12 and 42 turn off, transistors 16 and 32 turn on, and output terminal 30 assumes a logic "0" value. The NOR function in the feedback path ensures that the gate of transistor 32 is only turned on to establish the high threshold level $V_H$ when transistors 12 and 42 are turned off, i.e., when the Schmitt trigger is in its logic "0" state. When the Schmitt trigger is in its logic "1" state, transistor 32 is turned off by the NOR feedback logic because transistors 12 and 42 are turned on.

A precise threshold level setting circuit 48 that compensates for temperature and process variations is employed in FIG. 3. Specifically, a voltage divider is formed by resistors 50, 52, 54 and 56 connected in series between power supply voltage $V_{DD}$ and ground. The junction of resistors 50 and 52 is connected to the gate of an n-channel MOS transistor 58. The junction of resistors 52 and 54 is connected to the gate of an n-channel MOS transistor 60. The junction of resistors 56 and 58 is connected to the gate of an n-channel MOS transistor 62. The sources of transistors 58, 60 and 62 are connected to ground. The drains of transistors 58, 60 and 62 are connected to the drains of p-channel MOS transistors 64, 66 and 68, respectively. The gates of transistors 64, 66 and 68 are each connected to their drains to form a diode connected structure. The gates of transistors 64, 66 and 68 are also connected by capacitors 70, 72 and 74, respectively, to power supply voltage $V_{DD}$. The sources of transistors 64, 66 and 68 are also connected to power supply voltage $V_{DD}$. The gate and drain of transistors 64, 66 and 68 are connected to bias voltage buses 76, 78 and 80, respectively, Buses 76, 78 and 80 are connected to the gates of transistor 34, transistor 20 and transistor 26, respectively, of one or more Schmitt trigger stages as shown in FIG. 3. In the case of a plurality of parallel Schmitt trigger stages, such as might be incorporated on an integrated circuit chip, a single threshold setting circuit 48 furnishes bias voltage to all the Schmitt triggers.

Transistors 58, 60 and 62 are connected to function as current sources. Their W/L ratios, together with the different voltages applied to their gates by the voltage divider, establish threshold levels $V_L$, $V_H$ and $V_M$. The W/L ratios of transistors of transistors 42, 18, and 12 preferably match those of transistors 58, 60, and 62, respectively. By way of example, W/L ratio of transistors 58 and 42 could be 70/3.5, the W/L ratio of transistors 60 and 18 could be 43.5/7, and the W/L ratio of transistors 62 and 12 could be 350/3.5. The diode connected transistors 64, 66 and 68 convert the current generated by transistors 58, 60 and 62, respectively to voltages which are, in turn, applied to the gates of transistors 34, 20 and 26, respectively, so the current therethrough mirrors the current through transistors 58, 60 and 62, respectively. Transistors 34, 20, 26, 64, 66 and 68 all have the same W/L ratio, e.g., 350/7. As a result, the process and temperature variations of transistors 42, 18, and 12 are compensated by transistors 58, 60, and 62, respectively, the process and temperature variations of transistors 34, 20 and 26 are compensated by transistors 64, 66 and 68, respectively, and a precise threshold level for $V_L$, $V_H$ and $V_M$ can be set and maintained over temperature and process.

Figure 4:
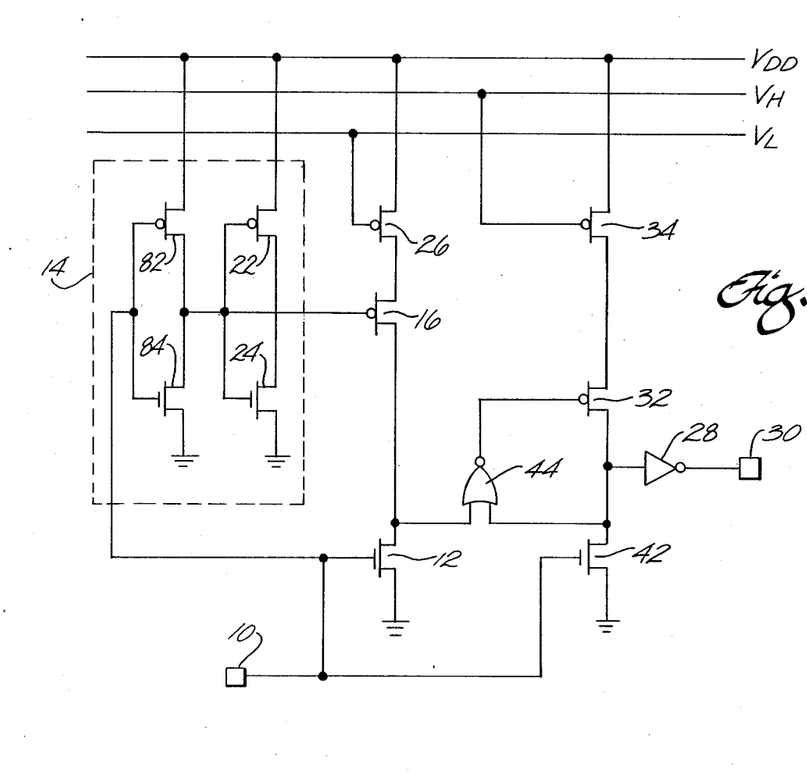
FIG. 4 is a schematic circuit diagram of the further embodiment of the invention.

In the embodiment shown in FIG. 4, the components in common with the previously described embodiments also bear the same reference numerals. The Schmitt trigger is the same as in FIG. 3. Transition circuitry 14 is the same as in FIG. 1, except that the first inverter comprises a pair of CMOS transistors 82 and 84. Input terminal 10 is connected to the gates of transistors 82 and 84, and their drains are connected together and to the gates of transistors 22 and 24 which, as in the embodiment of FIG. 1, comprise the second inverter. The source of transistor 82 is connected to power supply voltage $V_{DD}$, and the source of transistor 84 is connected to ground. The threshold level $V_M$ of transition circuitry 14 is set by the W/L ratio of transistors 82 and 84. For example, by increasing the W/L ratio of the p-channel device, i.e., transistor 82, relative to the n-channel device, i.e., transistor 84, the threshold level $V_M$ is raised, and vice versa. This version of transition circuitry 14 has the advantage, vis-a-vis the previously described version, that it does not consume as much power, i.e., there is not much idling current, when the input drive signal is not switching, and has the disadvantage that the threshold level $V_M$ cannot be set as accurately.

Figure 5:
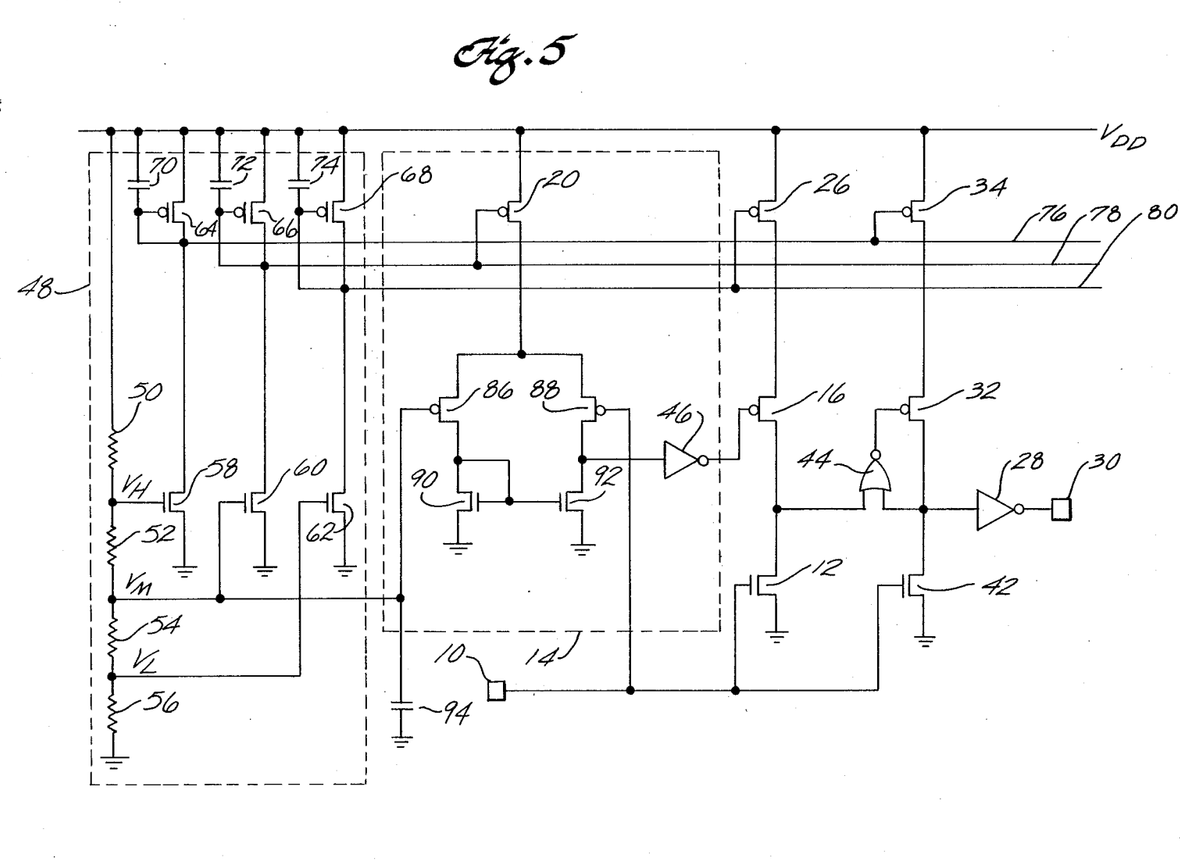
FIG. 5 is a schematic circuit diagram of still another embodiment of the invention.

In FIG. 5, the same Schmitt trigger described in connection with FIG. 3 is shown, with yet a different version of transition circuitry 14. The threshold setting circuitry of FIG. 3 is also shown. The components of the previously described circuitry bear the same reference numerals in FIG. 5. The first inverter in this embodiment comprises a differential circuit. Specifically, the sources of a pair of p-channel matched MOS transistors 86 and 88 are connected to the drain of transistor 20. The sources of another pair of matched n-channel MOS transistors 90 and 92 are connected to ground. These transistor pairs are matched in a sense that they have the same W/L ratio. The junction of resistors 52 and 54 is connected to the gate of transistor 86. A capacitor 94 is connected between the gate of transistor 86 and ground. The drain of transistor 90 is connected to its gate in a diode configuration and to the drain of transistor 86. The gates of transistors 90 and 92 are connected together. The drain of transistor 92 is connected to the input of inverter 46 and drain of transistor 88. The source of transistors 90 and 92 are connected to ground.

In operation, when the input signal on terminal 10 is at a logic "0" level or a logic "1" level, the current set by the bias voltage applied to transistor 20 flows in balanced fashion through transistors 86 and 90 to ground, and through transistors 88 and 92 to ground. When the input signal at terminal 10 rises above the threshold level $V_M$ toward a logic "1" value, the current flow becomes imbalanced, more current flowing through transistor 86 than through transistor 88. This raises the voltage at the gate of transistor 92, rendering it more conductive and discharging the input capacitance of inverter 46. As a result, the voltage level at the gate of transistor 16 rises almost to power supply voltage $V_{DD}$. When the input signal at terminal 10 drops below the threshold level $V_M$ toward a logic "0" value, more current flows through transistor 88 than transistor 86, thereby turning transistor 92 off and charging the input capacitance of inverter 46. As a result, the gate voltage applied to transistor 16 is near ground. This embodiment of transition circuitry 14 with a differentially configured first inverter has the advantages that transition time over process and temperature exhibits less variation, because current is switched in the first inverter, and a more accurate threshold setting because changing transistor parameters over temperature and process are balanced out. In this arrangement, transistors 20 and 66 could have a different W/L ratio, i.e. 175/7. Typically, transistors 86 and 88 would have a W/L ratio of 25/3, and transistors 90 and 92 would have a W/L ratio of 12.5/3.

Figure 6:
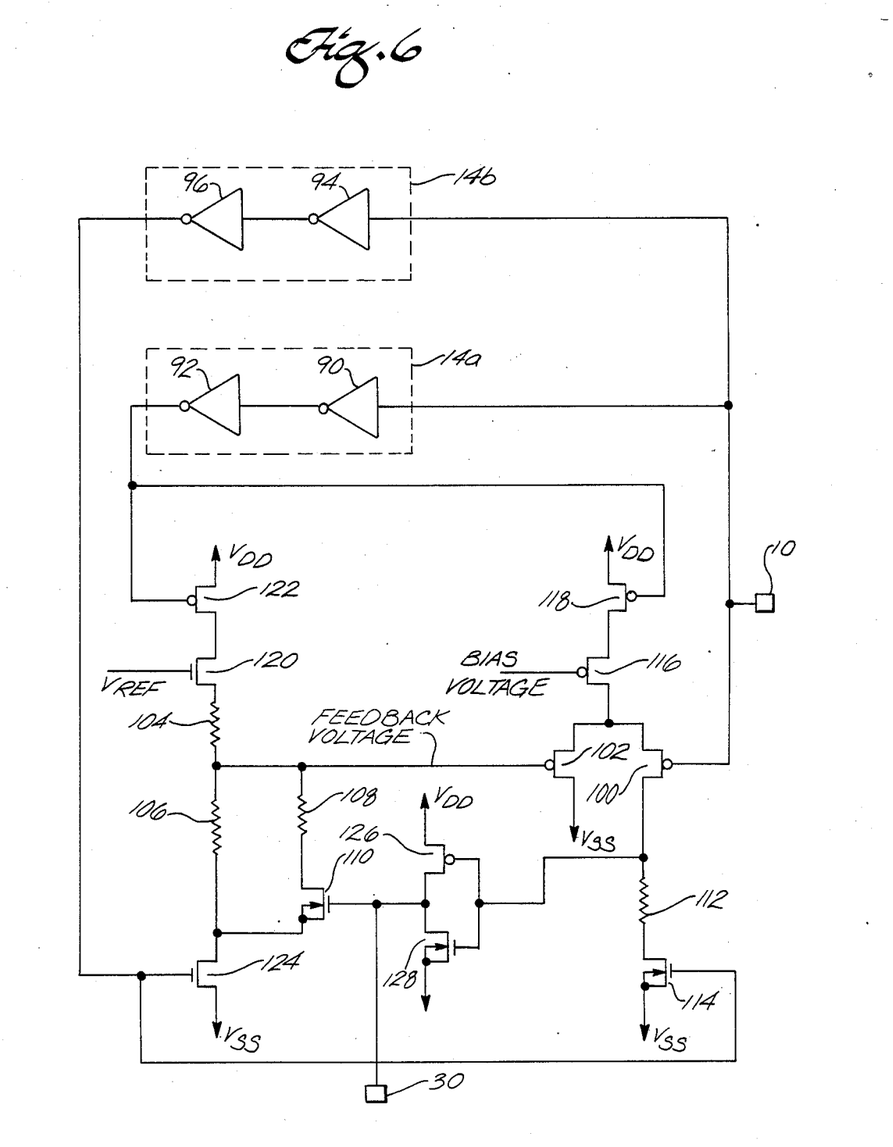
FIG. 6 is a schematic circuit diagram of yet a further embodiment of the invention.

In many cases, one logic value of the source driver input signal is sufficiently close to the rail voltage to turn off the power completely without level shifting. Thus, in the embodiments of FIGS. 1, 3, 4 and 5, the maximum logic "0" value is assumed to be 0.8 volts, which, in many cases, is sufficiently close to ground to cut off any idling current through the input transistor, i.e., transistor 12. However, in some situations it may be desirable to shift the level of both logic levels applied to the Schmitt trigger closer to the rail. In FIG. 6 the invention is applied to another Schmitt trigger to illustrate level shifting with respect to both logic valves of the source driver input signal. A transition circuit 14a shown schematically as comprising a first inverter 90 and a second inverter 92 shifts the level of the input signal at a logic "1" value. A transition circuit 14b shown schematically as comprising a first inverter 94 and a second inverter 96 shifts the level of the input signal at a logic "0" value. Each of transition circuits 14a and 14b could be implemented in any one of the ways illustrated in FIGS. 1, 4 or 5. The threshold level $V_H$ of transition circuit 14a is preferably set at point 40 (FIG. 2), as previously discussed. The threshold level $V_N$ of transition circuit 14b is preferably set at a point 98 between low threshold level $V_L$ and the maximum "0" value (FIG. 2).

Input terminal 10 is directly connected to the gate of a p-channel MOS transistor 100. The source of transistor 100 is connected to the source of another p-channel MOS transistor 102. Resistors 104, 106 and 108 together with an n-channel MOS transistor 110 form a switchable voltage divider. Resistors 104 and 106 are connected in series, and resistor 108 is connected in series with the drain and source of transistor 110 across resistor 10. The junction of resistors 104, 106 and 108 is connected to the gate of transistor of 102. Transistors 100 and 102 are connected in a differential configuration. The drain of transistor 102 is connected to VSS and the drain of transistor 100 is connected by a resistor 112 to the drain of an n-channel MOS transistor 114. The source of transistor 114 is connected to power supply voltage VSS. The sources of transistor 100 and 102 are connected to the drain of a p-channel MOS transistor 116. The source of transistor 116 is connected to the drain of a p-channel MOS transistor 118. The gate of transistor 116 is connected to an intermediate bias voltage to establish a bias current through transistor 116. The source of transistor 118 is connected to power supply voltage VDD. The source of an n-channel MOS transistor 120 is connected to one end of resistor 104. The drain of transistor 120 is connected to the drain of a p-channel MOS transistor 122. A voltage reference is applied to the gate of transistor 120. The source of transistor 122 is connected to voltage $V_{DD}$. The drain of an n-channel MOS transistor 124 is connected to one end of resistor 106. The source of transistor 124 is connected to supply voltage VSS. The gate of transistor 110 is connected to the drain of a p-channel MOS transistor 126 and the drain of an n-channel MOS transistor 128. The gates of transistors 126 and 128 are connected to the junction of resistor 122 and the drain of transistor 100. The source of transistor 126 is connected to power supply voltage $V_{DD}$. The source of transistor 128 is connected to power supply voltage $V_{SS}$. Input terminal 10 is coupled by transition circuitry 14a to the gates of transistors 118 and 122 to shift the level of the input signal applied thereto at the logic "1" value near to the upper rail, i.e., 5.0 volts. Input terminal 10 is coupled by transition circuitry 14b to the gates of transistors 114 and 124 to shift the level of the input signal applied thereto at the logic "0" level near to the lower rail, i.e., ground. The drains of transistors 126 and 128 and the gate of transistor 110 are connected to output terminal 30.

When the source driver input signal is at $V_{SS}$ or near $V_{SS}$, transistor 100 is turned on and transistor 114 is turned off. Transistors 118 and 122 are turned on and 124 is turned off. Transistor 128 is turned on to connect output terminal 30 near ground level, i.e., a logic "0" value, and to turn transistor 110 off. As a result, the voltage divider comprises resistors 104 and 106, to the exclusion of resistor 108, and a large feedback voltage is applied to the gate of transistor 102 to establish the high threshold level $V_H$.

When the source driver input signal at or near $V_{DD}$ terminal 10 is at a logic "1" value, transistors 100, 118 and 122 are turned off and transistors 114 and 124 are turned on. As a result, power supply voltage VDD is connected to output terminal 30 through transistor 126 to establish the logic "1" level thereat and transistor 110 is turned on the place resistor 108 in parallel with the resistor 106 and thus reduce the feedback voltage applied to the gate of transistor 102 to establish the low threshold $V_L$.

When the input terminal 10 is at a logic-0 voltage, but the input voltage is greater than the switching threshold of transition circuit 14b and less than the switching threshold of transition circuit 14a, then transistors 114, 124, 118 and 122 are on. The drain of transistor 100 is high and the gate of transistor 110 is low. The high switching threshold $V_H$ is then established by the resistor divider ratio of resistors 104 and 106.

When the input terminal 10 is at a logic-1 voltage, but the input voltage is less than the switching threshold of transition circuitry 14a and greater than the switching threshold of transition circuitry 14b, then transistor 114, 124, 118 and 122 are on. The drain of transistor 100 is low and the gate of transistor 110 is high. The switching threshold $V_L$ is established by the resistive divider of resistors 104, and 106 in parallel with resistor 108.

The described embodiments of the invention are only considered to be preferred and illustrative of the inventive concept; the scope of the invention is not to be restricted to such embodiments. Various and numerous other arrangements may be devised by one skilled in the art without departing from the spirit and scope of this invention.

What is claimed is:

1. A Schmitt trigger circuit comprising:
a source of signals to be processed;
first and second complementary switching means each having an input terminal;
a common output terminal to which the first and second switching means are connected such that the state of the output terminal is representative of the state of the first and second switching means;
first means for biasing the first and second switching means such that for a low input signal level the switching means are in a first combination of complementary states and for a high input signal level the switching means are in a second combination of complementary states;
second means for biasing the first and second switching means such that for a signal increasing from the low input signal level the state of the first switching means changes before the second switching means at a first threshold level;
third means for biasing the first and second switching means such that for a signal decreasing from the high input signal level the state of the second switching means changes at a second threshold level that is lower than the first threshold level; and
means operative above the second threshold level for coupling the source to the input terminal of the second switching means such that for a signal increasing from the low input signal level the input signal level is raised sufficiently to advance the change of state of the second switching means.

2. The Schmitt trigger circuit of claim 1, in which the first and second switching means comprise a pair of CMOS transistors.

3. The Schmitt trigger circuit of claim 2, in which the first biasing means comprises a voltage bias source and means for connecting the pair of transistors in series across the voltage source.

4. The Schmitt trigger circuit of claim 3, in which the third biasing means comprises a first constant current source connected in series with the transistors across the voltage source.

5. The Schmitt trigger circuit of claim 4, in which the second biasing means comprises a second constant current source and means for connecting the second constant current source in parallel with the first constant current source and in series with the transistors across the voltage source when the switching means are in the first combination of states, while disconnecting the second constant current source when the switching means are in the second combination of states.

6. A Schmitt trigger circuit comprising:
a source of signals to be processed;
first and second complementary switching means each having an input terminal, the first and second switching means being in a first combination of complementary states for a low signal level at their input terminals and in a second combination of complementary states for a high signal level at their input terminals;
first means for biasing the first and second switching means such that for a signal at their input terminals increasing from the low signal level the first switching means changes state before the second switching means at a threshold level below the high signal level;
second means for biasing the first and second switching means such that for a signal at their input terminals decreasing from the high signal level the state of the second switching means changes at a second threshold level below the first threshold level;
means for indirectly coupling the source to the input terminal of the second switching means to apply thereto the high signal level when the signal level of the source is at a third threshold level between the second threshold level and the high signal level; and
means for directly coupling the source to the input terminal of the first switching means so the signal level applied thereto tracks the source.

7. The Schmitt trigger of claim 6 in which the first switching means is on and the second switching means is off in the first combination of states.

* * * * *